(12) United States Patent
Dalton et al.

(10) Patent No.: US 7,145,398 B2
(45) Date of Patent: Dec. 5, 2006

(54) COARSE FREQUENCY DETECTOR SYSTEM AND METHOD THEREOF

(75) Inventors: Declan M. Dalton, County Limerick (IE); Lawrence M. DeVito, Tewksbury, MA (US); Mark Ferriss, County Cork (IE); Paul J. Murray, County Limerick (IE)

(73) Assignee: Analog Devices, Inc., Norwood, MA (US)

( * ) Notice: Subject to any disclaimer, the term of this patent is extended or adjusted under 35 U.S.C. 154(b) by 32 days.

(21) Appl. No.: 10/893,198

(22) Filed: Jul. 16, 2004

(65) Prior Publication Data

US 2005/0057290 A1   Mar. 17, 2005

Related U.S. Application Data

(60) Provisional application No. 60/490,649, filed on Jul. 28, 2003.

(51) Int. Cl.
*H03D 13/00* (2006.01)
*H03L 7/89* (2006.01)

(52) U.S. Cl. ............ 331/1 A; 331/11; 331/23; 331/25; 327/49

(58) Field of Classification Search ............ 331/1 A, 331/10–11, 18, 23, 25; 327/39–41, 47, 49
See application file for complete search history.

(56) References Cited

U.S. PATENT DOCUMENTS

| 4,308,505 | A | | 12/1981 | Messerschmitt |
| 5,648,744 | A | * | 7/1997 | Prakash et al. ............... 331/11 |
| 2004/0124929 | A1 | * | 7/2004 | Ishiwaki ..................... 331/1 R |

OTHER PUBLICATIONS

D.G. Messerschmitt, "Frequency Detectors for PLL Acquisition in Timing and Carrier Recovery" IEEE Transactions on Communications, vol. 27(9), Sep. 1979, 1288-1295.
S.S. Paik, "The Design and Implementation of a New Wide Range Frequency Detector," Master's Thesis, MTT, Jul. 28, 1998.

* cited by examiner

*Primary Examiner*—David Mis
(74) *Attorney, Agent, or Firm*—Iandiorio & Teska

(57) ABSTRACT

An improved coarse frequency detector includes a first storage device responsive to a data signal and a sub-multiple of a clock signal for detecting a first transition in the data signal during a predetermined state of the sub-multiple of the clock signal and generating an intermediate signal, and a second storage device responsive to the data signal and the intermediate signal for detecting a second transition in the data signal having the same polarity as the first transition during the predetermined state of the sub-multiple of the clock signal and generating an up-pulse.

32 Claims, 10 Drawing Sheets

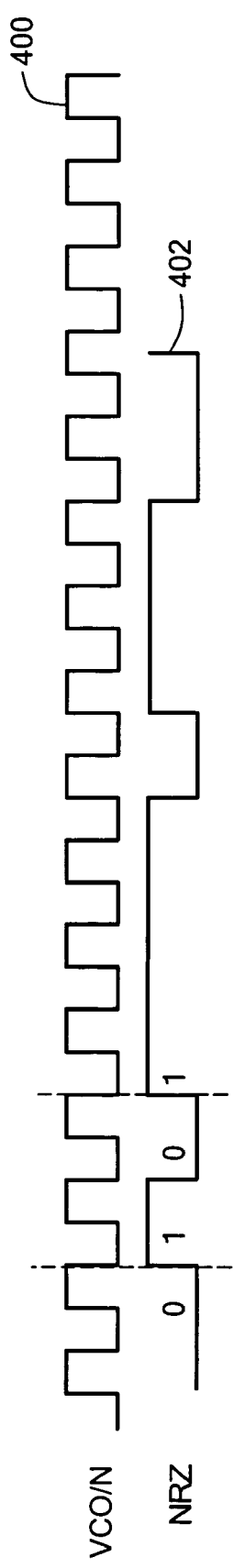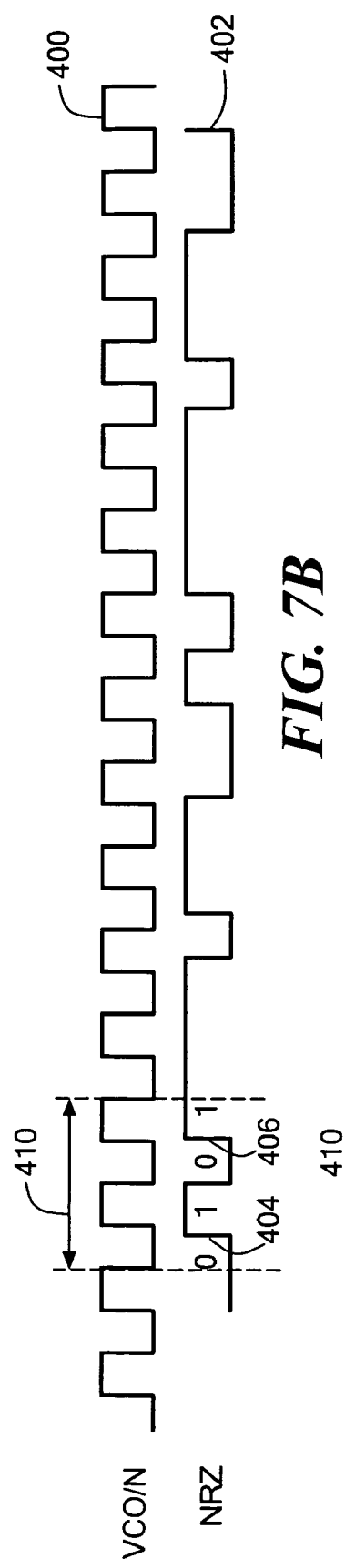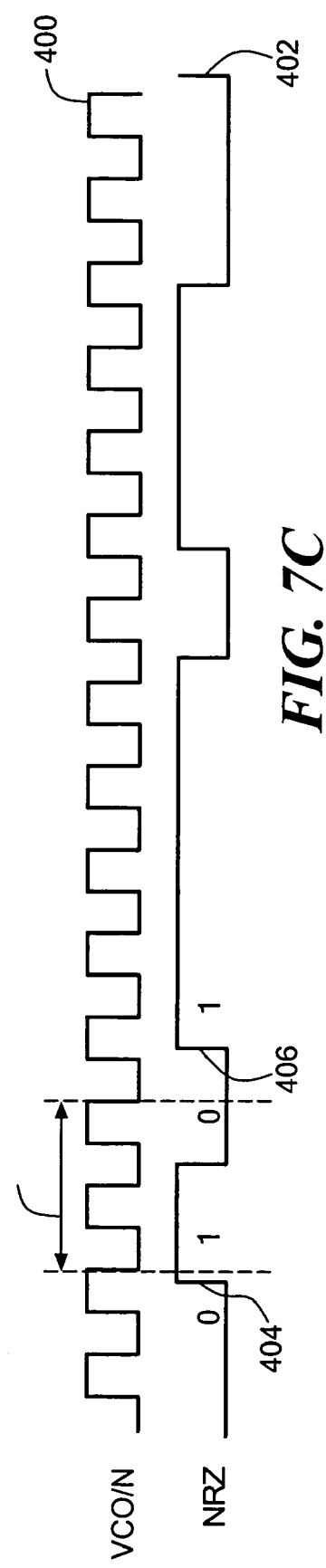

COARSE FREQUENCY DETECTOR SYSTEM AND METHOD THEREOF

RELATED APPLICATIONS

This application claims the benefit of U.S. Provisional Application No. 60/490,649 filed Jul. 28, 2003, incorporated by reference herein.

FIELD OF THE INVENTION

This invention relates generally to an improved coarse frequency detector (CFD) system and method and more particularly to an improved frequency lock loop CFD system.

BACKGROUND OF THE INVENTION

A fiber optic communications link typically includes a transmitter which transmits and directs light emitted from a laser diode through a fiber optic cable. At the receiving end of the fiber optic cable the light is detected by a photo detector and converted into an electrical current. The current is converted to voltage by a transimpedance amplifier and then amplified by a limiting amplifier. The amplified voltage signal is applied to a clock and data recovery (CDR) circuit which extracts a clock signal from the received data (e.g., NRZ data). The CDR compares the frequency of the clock signal to frequency of data signal and adjusts the frequency of the clock signal to equal the frequency of the data signal to achieve a frequency lock (acquisition). The clock and data recovery circuit also acquires and tracks the phase of the incoming data, which is known as phase acquisition.

The CDR circuit typically utilizes a frequency lock loop (FLL) for frequency acquisition and a phase lock loop (PLL) circuit for phase acquisition. The FLL typically includes a frequency detector, a charge pump, a loop filter, a voltage controlled oscillator (VCO) and a digital divider. The PLL circuit typically includes the same components as the FLL, but utilizes a phase detector instead of a frequency detector.

The frequency detector of the FLL is typically implemented with two distinct devices which include a coarse frequency detector (CFD) and a fine frequency detector. The function of the CFD is to adjust the frequency of the clock signal so that it is close to the frequency of the incoming data signal, e.g., the frequency of clock signal is within about 10% of the frequency of the data signal. Then the fine frequency detector takes over and adjusts the frequency of the clock signal so that it is very close, e.g., within about 500 ppm, of the frequency of the data signal.

A typical CFD compares the frequency of the clock signal to the frequency of the data signal and produces a frequency up-pulse when the frequency of the clock signal is less than the frequency of the data signal. The CFD continues comparing the frequency of the clock signal to the frequency of the data signal until the frequency of clock signal is close to the frequency of the data signal. The frequency up-pulse is applied to a charge pump which generates a current up-pulse. The current up-pulse is applied to a loop filter which applies an increase in the voltage to the VCO. The VCO then increases its output frequency proportional to the amount of voltage applied to it, known as the frequency step size.

Conventional CFDs do not control the width of the frequency up-pulses generated by the CFD and as a result often produce up-pulses with very small pulse widths especially when the frequency of the clock signal approaches the frequency of the data signal. The result is that frequency step size is often very small which means the frequency of the clock signal is increased in very small increments which increases the frequency acquisition time. A single narrow frequency up-pulse applied to the charge pump results in a change as small as about 10 ppm (e.g., 0.001%) in the VCO frequency. Moreover, up-pulses with very narrow pulse widths require a more complex and high speed charge pump.

Moreover, conventional CFDs are designed to detect both the rising and falling transitions of a single positive or negative pulse in the data signal. A conventional CFD compares the width of a single pulse in the data signal to a single clock period to determine if the frequency of the clock signal is less than the frequency of the data signal. However, because the data signal is typically transmitted by a laser, the 1's can be narrower than the 0's. The result is that conventional CFDs are susceptible to bimodal jitter (BMJ). BMJ arises when one edge of the data sees a different delay than the other edge and has the effect of making a single pulse narrower than it should be. Because conventional CFDs are comparing both the rising and the falling transition of a single pulse of the data signal, when the falling edge of the data occurs too fast, e.g., in the case of a transmitted 1, BMJ has the effect of making the data appear at a higher frequency than it actually is which results in a large residual frequency error.

Conventional CFDs also typically employ at least four parallel circuits (slices) which each includes at least two storage devices, e.g., flip-flops. The clock signal is divided (typically by 2) to generate two reset signals which are stored in the two storage devices. The two reset signals act as windows to be compared to the incoming data signal. If a single positive or negative pulse exists within either of the two reset windows, then the frequency of the clock is slow and the CFD generates an up-pulse to increase the frequency of the clock.

The result, as discussed above, is that conventional CFDs rely on detecting both positive and negative transitions of each positive and negative pulse in the data signal which results in BMJ and large residual frequency error. Moreover, the design of conventional CFDs is complex, requiring both storage devices to have three inputs for the data, clock and reset signals. Employing three inputs on both storage devices is difficult to implement at high frequencies. An example of one such prior art CFD is disclosed in "The Design and Implementation of a New Wide Range Frequency Detector" by Steve S. Paik, MEEE Report, MIT, July 1998, incorporated by reference herein.

SUMMARY OF THE INVENTION

It is therefore an object of this invention to provide an improved coarse frequency detector system and method thereof.

It is a further object of this invention to provide such an improved coarse frequency detector system and method which detects two transitions of the same polarity in the data signal to determine when the frequency of the clock signal is less than the frequency of the data signal and provide an up-pulse to increase the clock frequency.

It is a further object of this invention to provide such an improved coarse frequency detector system and method which eliminates the effect of bimodal jitter.

It is a further object of this invention to provide such an improved coarse frequency detector system and method which controls the width of the frequency up-signal.

It is a further object of this invention to provide such an improved coarse frequency detector system and method which is easier to implement at high frequencies.

It is a further object of this invention to provide such an improved coarse frequency detector system and method which is simpler in design.

It is a further object of this invention to provide such an improved coarse frequency detector system and method which reduces frequency acquisition time.

It is a further object of this invention to provide an improved FLL coarse frequency detector system which increases the frequency step size generated by a voltage controlled oscillator.

It is a further object of this invention to provide such an improved FLL coarse frequency detector system and method which increases the clock frequency by incrementing a frequency adjustment bit pattern that selects a frequency band of a voltage controlled oscillator and a divider ratio of a digital divider circuit to efficiently increase the clock frequency.

This invention results from the realization that a new and improved coarse frequency detector system and method which eliminates bimodal jitter and the large residual frequency error associated therewith can be achieved by determining when the frequency of the clock signal is less than the frequency of the data signal by detecting successive transitions of the same polarity in the data signal (e.g., two rising transitions) during a predetermined state of the clock signal and providing a frequency up-pulse in response to the detected transitions to adjust the frequency of the clock signal to be close to the frequency of the data signal. This invention results from the further realization that an improved FLL course frequency detector system can be achieved by generating and incrementing a frequency adjustment bit pattern in response to the frequency up-pulse to select a frequency band of a voltage controlled oscillator and a divider ratio of a digital divider to define an incremental increase in the frequency of the clock signal and adjust the frequency of the clock signal to be close to the frequency of the data signal.

This invention features an improved coarse frequency detector including a first storage device responsive to a data signal and a sub-multiple of a clock signal for detecting a first transition in the data signal during a predetermined state of the sub-multiple of the clock signal and generating an intermediate signal, and a second storage device responsive to the data signal and the intermediate signal for detecting a second transition in the data signal having the same polarity as the first transition during the predetermined state of the sub-multiple of the clock signal and generating an up-pulse.

In one embodiment, the first and second transitions may be rising transitions. The first and second transitions may be falling transitions. The predetermined state of the divided clock signal may be equal to N periods of the clock signal. The predetermined state of the sub-multiple of the clock signal may be equal to two periods of the clock signal. The predetermined state of the sub-multiple of the clock signal may include a logic low. A first rising transition of the up-pulse may be generated in response to the detected second transition and the falling transition of the up-pulse may be generated in response to a next transition of the same polarity as the second transition. The up-pulse may have a width equal to at least two periods of the data signal. The sub-multiple of the clock signal may be generated by dividing the clock signal by a predetermined number. The coarse frequency detector system may include a plurality of storage devices defining two or more parallel detection circuits each responsive to a sub-multiple of the clock signal and the data signal for detecting target bit patterns having at least two transitions of the same polarity in the data signal within a predetermined state of the sub-multiples of the clock signal.

This invention features an improved coarse frequency detector including a plurality of storage devices responsive to a data signal and a sub-multiple of a clock signal for determining when the frequency of the clock signal is less than the frequency of the data signal by detecting a target bit pattern having successive transitions of the same polarity in the data signal during a predetermined state of the sub-multiple of the clock signal and generating an up-pulse.

In one embodiment, the target bit pattern may be chosen from the group consisting of 0101, 1010, 010101 and 101010.

This invention features an improved FLL coarse frequency detector system including a coarse frequency detector responsive to a data signal and a sub-multiple of a clock signal for determining when the frequency of the clock signal is less than the frequency of the data signal by detecting a target bit pattern having successive transitions of the same polarity in the data signal during a predetermined state of the sub-multiple of the clock signal and providing an up-pulse in response to the detected bit pattern, and a frequency acquisition circuit responsive to the up-pulse for generating and incrementing a frequency adjustment bit pattern that selects a frequency band of a multi-band voltage controlled oscillator and a divider ratio of a digital divider to increase the frequency of the clock signal until the frequency of the clock signal is close to the frequency of the data signal.

In one embodiment, the frequency adjustment bit pattern may include a plurality of least significant bits for selecting a frequency band of the voltage controlled oscillator and a plurality of most significant bits for selecting the digital divider ratio. The frequency acquisition circuit may increment the least significant bits to select a higher frequency band of the voltage controlled oscillator. The frequency acquisition circuit may increment the most significant bits to select a lower divider ratio to be applied to the digital divider to divide the clock signal by the divider ratio. The target bit patterns may be chosen from the group consisting of 0101, 1010, 010101, and 101010.

This invention also features an improved FLL coarse frequency detector system including a coarse frequency detector responsive to a clock signal and a data signal for generating an up-signal when the frequency of said clock signal is less than the frequency of the data signal, and a frequency acquisition circuit responsive to the up-signal for generating and incrementing a frequency adjustment bit pattern that selects a frequency band of a multi-band voltage controlled oscillator and a divider ratio of a digital divider to increase the frequency of the clock signal until the frequency of the clock signal is close to the frequency of the data signal.

This invention further features an improved FLL coarse frequency detector system including a coarse frequency detector responsive to a clock signal and a data signal for generating a down-signal when the frequency of the clock signal is greater than the frequency of the data signal; and a frequency acquisition circuit responsive to the down-signal for generating and decrementing a frequency adjustment bit pattern that selects a frequency band of a multi-band voltage controlled oscillator and a divider ratio of a digital divider to decrease the frequency of the clock signal until the frequency of the clock signal is close to the frequency of the data signal.

This invention also features an improved FLL coarse frequency detector system including a coarse frequency detector responsive to a sub-multiple of a clock signal and a data signal for determining when the frequency of the clock signal is less than the frequency of the data signal by detecting a target bit pattern having successive transitions of the same polarity in the data signal during a predetermined state the sub-multiple of the clock signal and providing a frequency up-pulse in response to the detected bit pattern, a frequency acquisition circuit responsive to the up-pulse for generating and incrementing a frequency adjustment bit pattern that selects a frequency band of a multi-band voltage controlled oscillator and a divider ratio of a digital divider to increase the frequency the clock signal, and a time-out circuit responsive to the up-pulse and the data signal configured to detect a predetermined time-out parameter for indicating the frequency of the clock signal is close to the frequency of the data signal and for generating a stop signal to disable the coarse frequency detector and the frequency acquisition circuit.

In one embodiment, the time-out circuit is responsive to the up-pulse and the clock signal for detecting a predetermined time-out parameter for indicating the frequency of the clock signal is close to the frequency of the data signal and for generating a stop signal to disable the coarse frequency detector and/or the frequency acquisition circuit. The up-pulse may initialize the time-out circuit. The time-out parameter may be a predetermined number of transitions of the data signal that have occurred since the time-out circuit was initialized. The transitions may be the rising edges of the data signal. The transitions may be the falling edges of the data signal. The time-out parameter may be a predetermined amount of time. The predetermined amount of time may be a predetermined number of cycles of the clock signal. The time-out circuit may include a binary counter configured to count the transitions of the data signal. The target bit pattern may be chosen from the group consisting of 0101, 1010, 010101 and 101010.

This invention features a method for locking the frequency of a clock signal to the frequency of a data signal, the method including a) initializing a frequency adjustment bit pattern to select a predetermined lowest frequency band of a multi-band voltage controlled oscillator and a predetermined highest divider ratio of a digital divider to provide a predetermined lowest clock frequency, b) detecting successive transitions of the same polarity in the data signal during a predetermined state of a sub-multiple of the clock signal to determine that the frequency of the clock signal is less than the frequency of the data signal and generating an up-pulse, c) incrementing the frequency adjustment bit pattern in response to the up-signal to select a frequency band of a multi-band voltage controlled oscillator and a divider ratio applied to a digital divider circuit to increase the frequency of the clock signal, and d) repeating steps b) and c) until the frequency of the clock signal is coarsely equal to the data signal.

In one embodiment, the method may further include the step of detecting a predetermined time-out parameter for indicating the frequency of the clock signal is close to a predetermined amount of the frequency of a data signal and for generating a stop signal to disable the coarse frequency detector and/or a frequency acquisition circuit. The method may further include the step of detecting a target bit pattern having successive transitions of the same polarity in the data signal during a predetermined state of a divided clock signal to determine when the frequency of the clock signal is less than the frequency of the data signal.

BRIEF DESCRIPTION OF THE DRAWINGS

Other objects, features and advantages will occur to those skilled in the art from the following description of a preferred embodiment and the accompanying drawings, in which:

FIGS. 7A–7C are timing diagrams showing an example of when the frequency of the clock signal is equal to, less than, and greater than the frequency of the data signal;

PREFERRED EMBODIMENT

Figure 1:
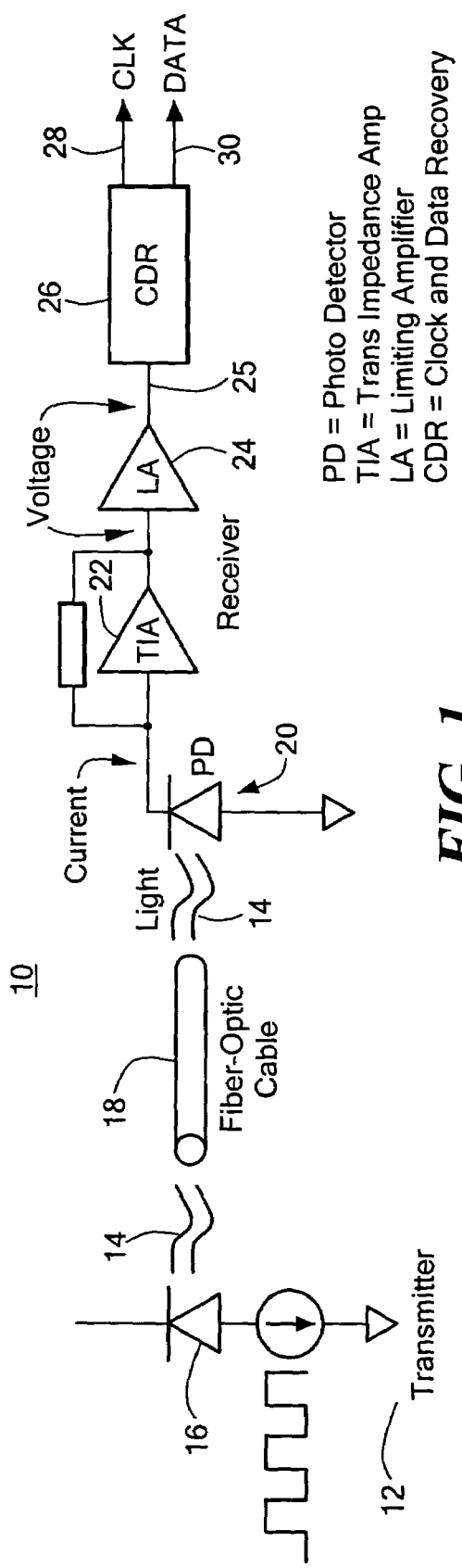
FIG. 1 is a schematic block diagram of a typical fiber-optic communications link.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

As discussed in the Background section above, fiber optic communications link 10, FIG. 1 typically includes transmitter 12 to transmit and direct light 14 emitted from laser diode 16 through fiber optic cable 18. At the receiving end of fiber optic cable 18 light 14 is detected by photodetector 20 which converts light 14 into an electrical current. The current is converted to a voltage by transimpedance amplifier 22 and then amplified by limiting amplifier 24. The limited and amplified signal on line 25 is then applied to clock and data recovery circuit 26 which extracts a clock signal on line 28 and a data signal on line 30.

Figure 2:
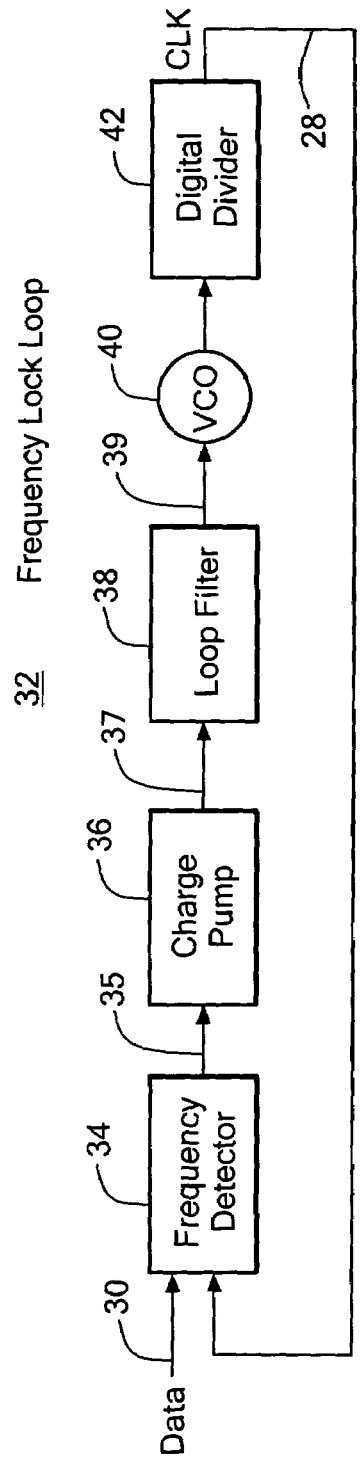
FIG. 2 is a schematic block diagram of a typical frequency lock loop used to lock the frequency of a clock signal to a data signal.

Frequency lock or acquisition is typically achieved with a frequency lock loop (FLL) 32, FIG. 2. Conventional FLL 32 typically includes frequency detector 34 which generates frequency up and frequency down-signals on line 35 which are applied to charge pump 36. Charge pump 36 generates up current or down current pulses on line 37 which are applied to loop filter 38. Loop filter 38 generates positive or negative voltages on line 39 which are applied to VCO 40. VCO 40 then increases or decreases the frequency of the clock signal on line 28 in order to lock the frequency of the clock signal on line 28 to the data signal on line 30. FLL 32 may also include digital divider 42 which divides the frequency of the clock signal by N.

Figure 3:
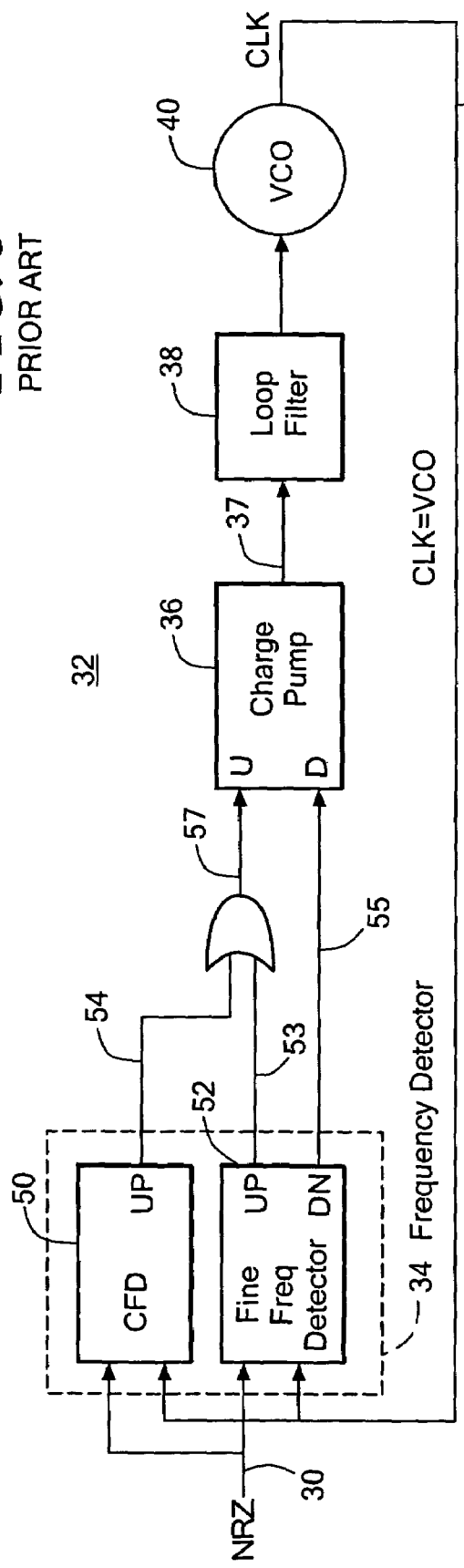
FIG. 3 is a schematic block diagram of a prior art FLL employing a coarse frequency detector and a fine frequency detector.

As discussed above, frequency detector 34, FIG. 3, of conventional FLL 32, where like parts have been given like numbers, is typically implemented with coarse frequency detector (CFD) 50 and a fine frequency detector 52. CFD 50 compares the frequency of the clock signal on line 28 to the frequency of the data signal on line 30 and provides an up-pulse on line 54 which is applied to charge pump 36 on line 57. As described above, charge pump 36, loop filter 38 and VCO 40 are used to increase the frequency of the clock signal on line 28 so that it is close to the frequency of the data signal on line 30, e.g., within about 10% as discussed above. Then fine frequency detector 52 takes over and adjusts the frequency of the clock signal on line 28 with up and down pulses on lines 53 and 55, respectively, which are applied to charge pump 36 to adjust the frequency of the clock signal on line 28, so that it is very close, e.g., within about 500 ppm, of the frequency of the data signal on line 30.

However, as discussed above, conventional CFD 50 relies on detecting both positive and negative transitions in the data signal on line 30. The result is that CFD 50 is susceptible to the effects of BMJ and the large residual frequency error associated therewith. Conventional CFD 50 also does not control the width of the frequency up-pulses generated on line 54 and as a result often generates frequency up-pulses with very small pulse widths. The small width frequency up-pulses on line 54 are applied to charge pump 36 which in turn generates narrow current up-pulses which are applied to loop filter 38. Loop filter then applies small voltages to VCO 40 which increases the frequency of the clock signal on line 28 in very small step sizes which increases the frequency acquisition time of FLL 32.

Figure 4:
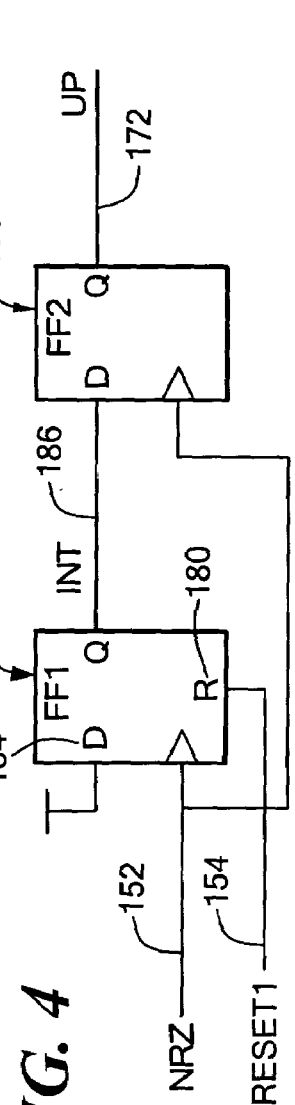
FIG. 4 is a schematic block diagram of one embodiment of the improved coarse frequency detector of this invention.

In contrast, improved coarse frequency detector (CFD) 150, FIG. 4 of this invention eliminates the need to rely on detecting both rising and falling transitions of the data signal on line 152 to detect when the frequency of the clock signal is less than the frequency of the data signal. CFD 150 detects two or more transitions of the same polarity (e.g., two rising edges) in the data signal on line 152 within a predetermined state of a sub-multiple of the clock signal (discussed below) on line 154 (RESET1) to determine that frequency of the clock signal is less than the frequency of the data signal and generate an up-pulse to increase the frequency of the clock signal so that it is close (e.g., within about 10%) to the frequency of the data signal. Moreover, CFD 150 can control the width of the up-pulse (e.g., increase the pulse width) so that the clock signal is increased in larger increments which decreases acquisition time.

Figure 5:
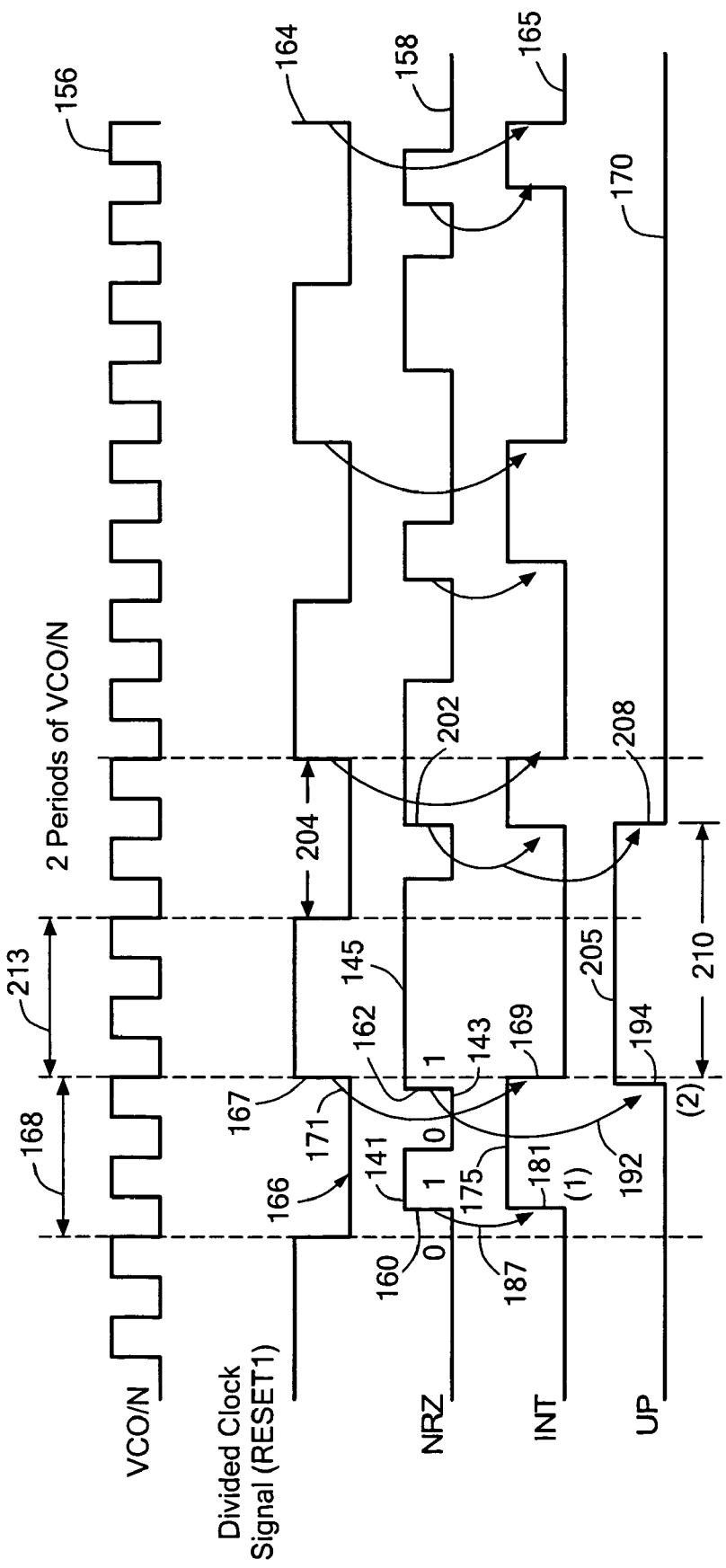
FIG. 5 is a timing diagram for the coarse frequency detector shown in FIG. 4.

The design and operation of CFD 150, FIG. 4 of this invention is now described with reference to the timing diagram shown in FIG. 5. CFD 150 includes storage device 182, FIG. 4, e.g., a D-type flip-flop, responsive to a sub-multiple of a clock signal on line 154 and a data signal on line 152 (e.g., NRZ data). Typically, the sub-multiple of the clock signal on line 154, e.g., divided clock signal 164, FIG. 5, is generated by dividing clock signal ($f_{vco}$/N) 156 by a predetermined number (discussed below). Storage device 182 is enabled when divided clock signal 164 is in a predetermined state, e.g., a logical low, as indicated at 166. Once enabled, storage device 182 detects a first transition in data signal 158, e.g., rising transition 160 and generates pulse 175 of intermediate signal 165 (discussed below). Storage device 190 is responsive to the intermediate signal on line 186 and detects a second transition in the data signal on line 152 which has the same polarity as the first transition, e.g., second rising transition 162, FIG. 5, of data signal 158 during the predetermined state of the divided clock signal (e.g., while RESET1 signal is low, as indicated at 166). If a second transition of the same polarity as the first transition in data signal 158 is detected (e.g., rising transitions 160 and 162) during the predetermined state of divided clock signal 164, indicated by arrow 166, up-pulse 205 of up-signal 170 is generated (discussed below) which is used to increase the frequency of clock signal 156 close to the frequency of data signal 158.

The logical low of divided clock signal 164 is maintained for two periods of clock signal 156, as indicated at 168. Once divided clock signal 164 goes high, as indicated by rising transition 167, storage device 182 is disabled.

Figure 6:
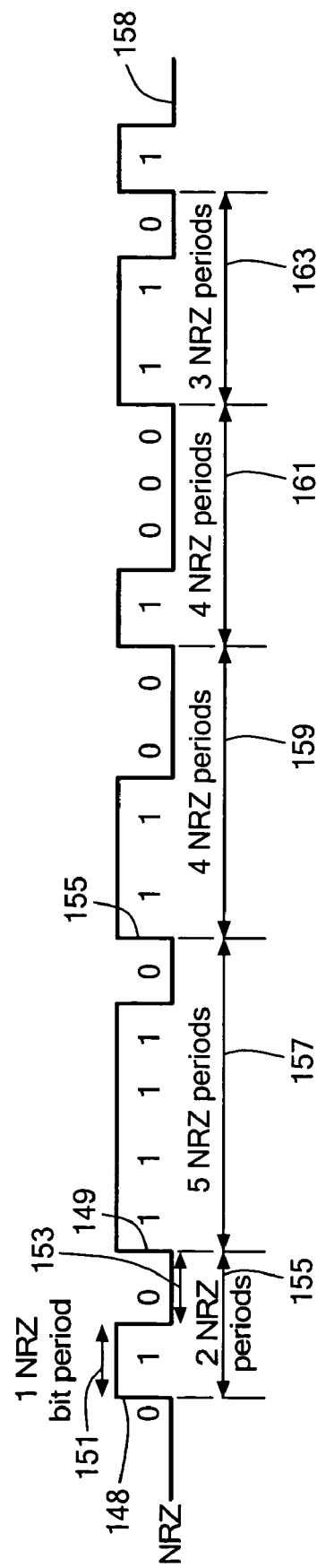
FIG. 6 is a timing diagram showing how the width of the up-pulse generated by the coarse frequency detector of this invention is equal to at least two bit periods of the data signal.

In operation, divided clock signal on line 154, FIG. 4, is applied to reset input 180 of storage device 182, e.g., D-type a flip-flop (FF1). D-input 184 of storage device 182 (FF1) is always set to a logical high. When divided clock signal 164, FIG. 5, is low, as indicated at 166 and a rising transition 160 of data signal 158 is detected by storage device 182 a logical 1 is clocked into storage device 182 (FF1) and intermediate signal 165 appears at 186, as indicated by arrow 187. If a second transition of the same polarity as the first transition, e.g., rising transition 162 of data signal 158, is detected in data signal 158 while divided clock signal 164 (RESET1) is still a logical low, as indicated by arrow 166, then the logic high at node 186 is clocked through storage device 190 (e.g., FF2) on line 172, as indicated by arrow 192, FIG. 5, to generate rising transition 194 of up-signal 170. On the next rising transition of data signal 158, e.g., rising transition 202, falling edge 208 of up-pulse 205 is generated. The result is that up-pulse 205 of up-signal 170 will always have a width equal to at least two bit periods of data signal 158. Because storage device 190, FIG. 4, is clocked by rising transitions of data signal 158, e.g., rising transition 162, up-signal 170 can only change on rising transitions of data signal 158. Hence, if rising transition 162 of data signal 158 causes up-signal 170 to go high, as indicated by arrow 192, up-signal 170 cannot change again until the next rising transition of data signal 158, e.g. rising transition 202, which is guaranteed to be at least two data bit periods later. FIG. 6 shows that the closest two rising transitions of data signal 158 can be is equal to at least two data bit periods, e.g., rising transitions 148 and 149 are separated by two data bit periods 151 and 153 of data signal 158. For example, the rising transitions, e.g., rising transition 149 and rising transition 155, may be five data bit periods apart, as indicated by arrow 157, four bit periods apart, as indicated by arrows 159 and 161, or three bit periods apart as indicated by arrow 163. The corresponding up-pulses generated by CFD 150 therefore have pulse widths equal to the number of data periods between the rising transitions, e.g., pulse widths equal to five, four or three bit periods of data signal 150.

Hence, the width of the up-pulses generated by CFD 150 of this invention is determined by the rising transitions of data signal 158 (e.g., the data stream) and will be at least two data bit periods wide. The result is wider up-pulses with large pulse widths are generated which increase the frequency step size of the VCO in an FLL (discussed below). Increasing frequency step size reduces acquisition time.

As shown above, coarse frequency detector 150 of this invention determines when the frequency of clock signal 156 is less than the frequency of data signal 158 by detecting the transitions of the same polarity in data signal 158 during the predetermined state of divided clock signal 164, e.g., while divided clock signal 164 is low and is maintained for at least two periods of clock signal 156 as indicated by arrow 168. The successive rising transitions detected by CFD 150 may be referred to as target bit patterns and may include 0101, 1010, 010101, 101010 or any target bit pattern know to those skilled in the art. When a detected target bit pattern is detected with the predetermined state of divided clock signal 164 the frequency of clock signal 156 must be less than the frequency of data signal 158.

For example, FIG. 7A shows an example when the frequency of clock signal 400 (at a frequency of VCO/N) is equal to the frequency of data signal 402. FIG. 7B shows an example when the frequency of clock signal 400 is less than the frequency of data signal 402. In this example, both rising transitions 404 and 406 occur within two periods of the clock signal 400, as indicated by arrow 410. FIG. 7C shows an example when the frequency of clock signal 400 is greater than the frequency of data signal 402 and shows that rising transitions 404 and 406 do not occur within two periods of clock signal 400, as indicated by arrow 410.

By detecting only rising transitions of data signal 158, FIG. 5, during the predetermined state of clock signal 156, the problems with bimodal jitter are eliminated as well as the large residual frequency error associated with bimodal jitter. CFD 150 also eliminates the need to employ three inputs for storage device 190, FIG. 4, which significantly simplifies the design and ability to implement the CFD 150 at higher frequencies.

Although as shown in FIGS. 4 and 5 CFD 150 detects the presence of at least two rising transitions of the data signal, this is not a necessary limitation of this invention as CFD 150 may also detect at least two falling successive transitions of data signal to determine when the frequency of the clock signal is less than the frequency of the data signal and generate an up-pulse to increase the frequency of the clock signal. For example, CFD 150 may include inverter 199 which inverts the data pulses on line 152. Hence, CFD 150 can detect two falling transitions in data signal on line 152 during the predetermined state of the clock signal.

Figure 8:
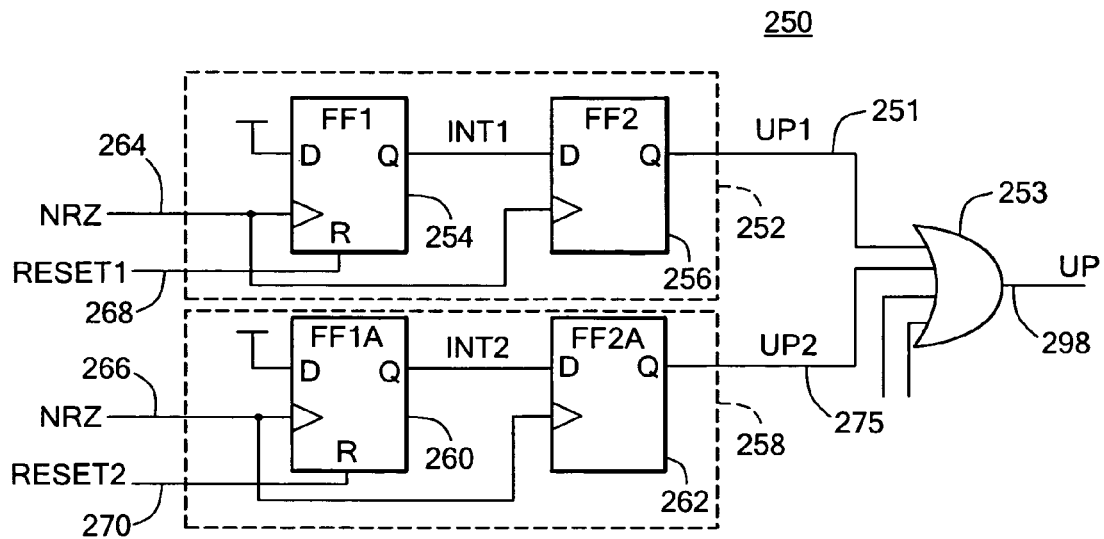
FIG. 8 is a schematic block diagram of another embodiment of an improved coarse frequency detector according to this invention.
Figure 9:
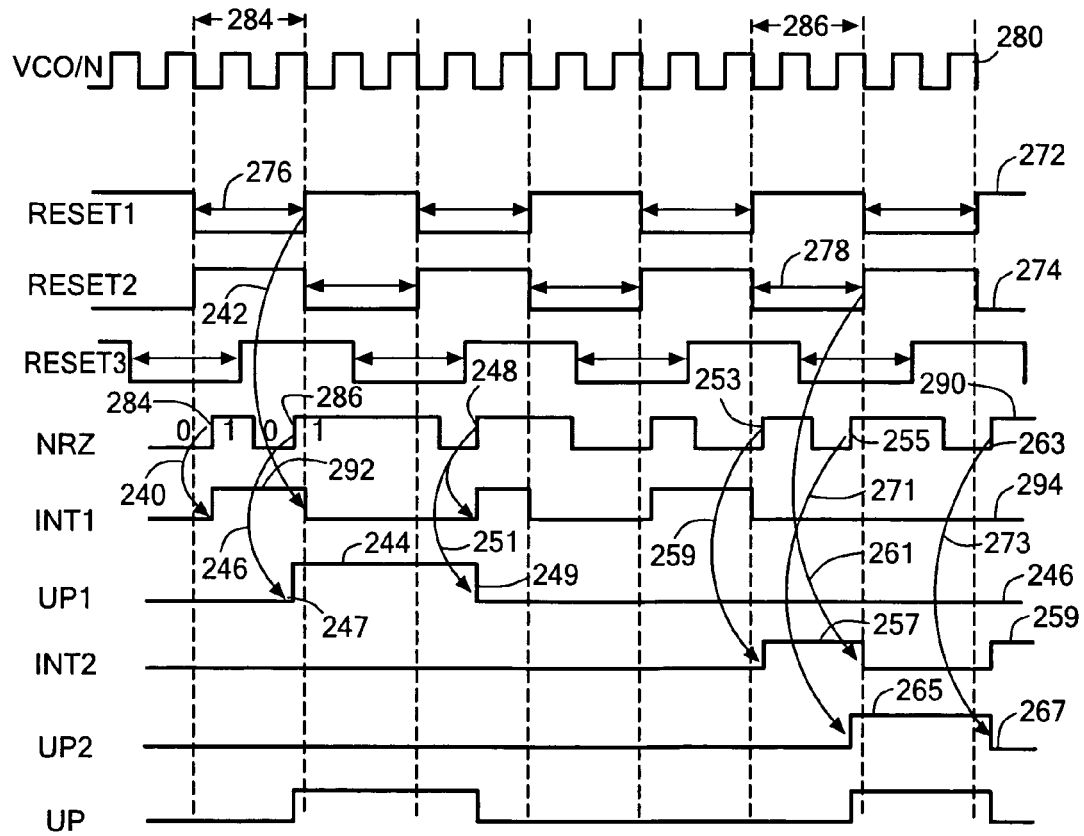
FIG. 9 is a timing diagram for the coarse frequency detector shown in FIG. 8.

CFD 250, FIG. 8, of this invention includes detection circuit 252 which includes first storage device 254 and second storage device 256. CFD 250 also includes detection circuit 258 which includes first storage device 260 and second storage device 262. First and second storage devices 254 and 256 of detection circuit 252 and first and second storage devices 260 and 262 of detection circuit 258 both function similar to storage devices 182 and 190, FIG. 4, as described above. Detection circuits 252 and 258, FIG. 8, are each responsive to the data signal on lines 264 and 266, respectively, and divided clock signals on lines 268 and 270, e.g., RESET1 and RESET2. In this example, the predetermined state of RESET1 signal 272, FIG. 9, and RESET2 signal 274, indicated by arrows 276 and 278, respectively, are each equal to two periods of clock signal 280, as indicated by arrows 284 and 286, respectively. Similarly as described above, detection circuits 252 and 258 each detect two successive transitions of the same polarity during predetermined state of RESET1 signal 272 and RESET2 signal 274, respectively. For example, detection circuit 252, FIG. 8, detects two rising transitions 284 and 286 in data signal 290 while RESET1 signal 272 is low, as indicated by arrow 276 to generate intermediate pulse 292 of intermediate signal 294, as indicated by arrows 240 and 242. Rising transition 247 of up-pulse 244 of up-signal 246 (UP1) is generated when second rising transition 286 is detected while RESET1 signal 272 is low as indicated by arrow 276. Falling transition 249 of up-signal 246 is generated on the next rising transition of data signal 290, e.g., transition 248 of data signal 290. Up-signal 246 (UP1) is propagated on line 251, FIG. 8, to OR gate 253. Similarly, as described above, detection circuit 258 detects two transitions of the same polarity in data signal 290, e.g., transitions 253 and 255 while RESET2 signal 274 is low, as indicated by arrow 278, to generate intermediate pulse 257 of intermediate signal 259, as indicated by arrows 259 and 261. Up-pulse 265 of up-signal 267 (UP2) is generated as described above and shown by 271 and 273. UP2 signal 267 is propagated on line 275, FIG. 8, to OR gate 253. The up-pulses on lines 251 and 275 are propagated through OR gate 253 on line 298 and are used to increase the frequency of clock signal 280, FIG. 9, close to the frequency of data signal 290. Additional detection circuits may be added in parallel to CFD 250, FIG. 8, as known by those skilled in the art to provide for additional detection of any desired target bit patterns.

Figure 10:
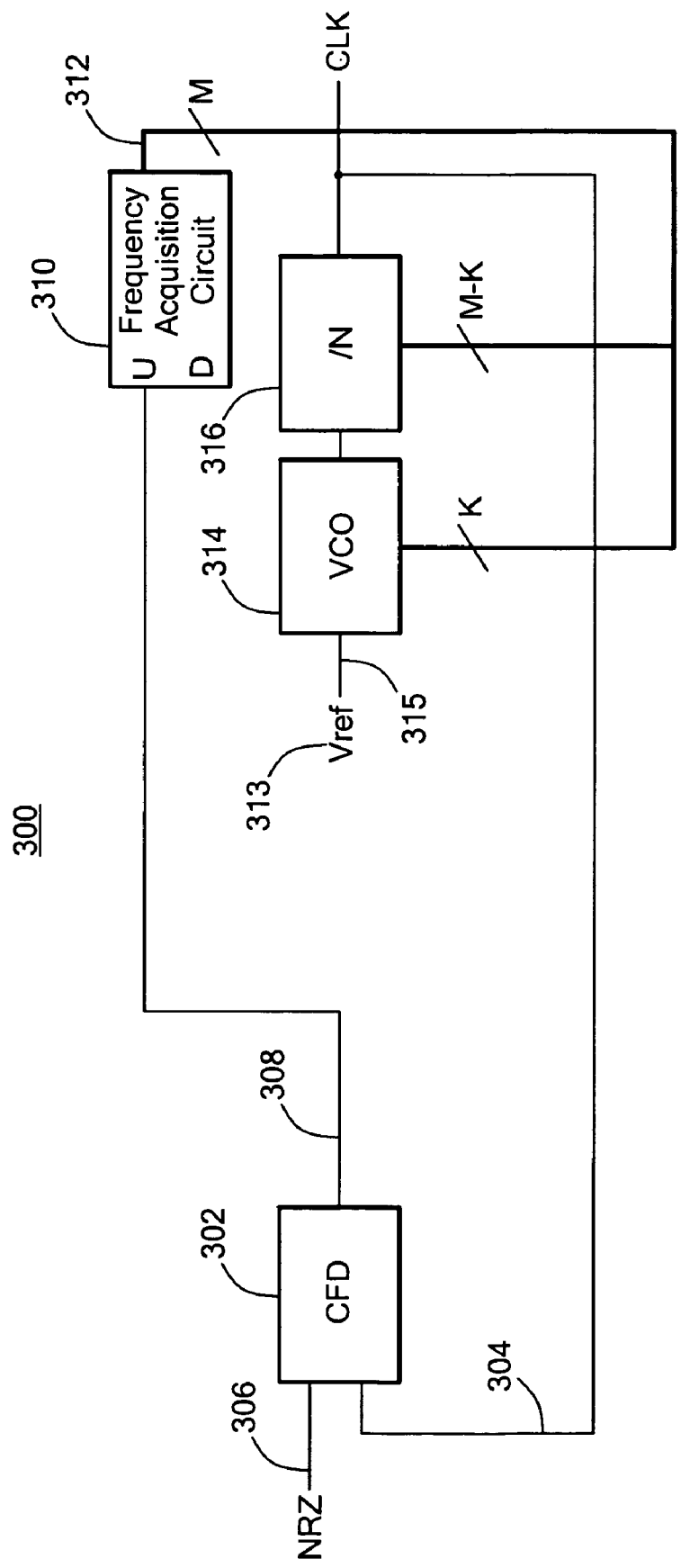
FIG. 10 is a schematic block diagram of an improved FLL coarse frequency detector system of this invention.

Improved frequency lock loop (FLL) coarse frequency detector system 300, FIG. 10 of this invention includes coarse frequency detector 302 responsive to a clock signal on line 304 and a data signal on line 306 and generates an up-signal on line 308 when the frequency of the clock signal on line 304 is less than the frequency of the data signal on line 306. CFD 302 may be typically of similar design as improved CFD 150 of this invention as described above, or, a conventional CFD as described in the Background Section above could also be utilized. FLL coarse frequency detector system 300 includes frequency acquisition circuit 310 responsive to the up-signal on line 308. Frequency acquisition circuit 310 generates and increments a frequency adjustment bit pattern on line 312 that selects a frequency band of multi-band voltage controlled oscillator 314 and a divider ratio (N) of digital divider 316 to increase the frequency of the clock signal on line 304 to be close to the frequency of the data signal on line 306, e.g., to increase the frequency of the clock signal on line 304 to close to the frequency of the data signal on line 306. The frequency of the clock signal on line 304 may be within about 50%, or in a preferred embodiment, within about 10% of the frequency of the data signal on line 306 when coarse acquisition is complete. The bit pattern generated by a frequency acquisition circuit 310 typically includes a plurality of least significant bits (LSB) for selecting the frequency band of multi-band voltage controlled oscillator 314 and a plurality of most significant bits (MSB) for selecting the divider ratio of digital divider 316. Table 1 below summarizes an example of the frequency adjustment bit pattern generated by frequency acquisition circuit 310.

TABLE 1

| M-bit code | | VCO frequency | Divider Ratio (N) | CLK frequency |
|---|---|---|---|---|
| MSB | LSB | | | |
| 0 0 | 0 0 | 1 G | 8 | 0.125 GHz |
| 0 0 | 0 1 | 1.33 G | 8 | 0.166 |
| 0 0 | 1 0 | 1.66 G | 8 | 0.208 |
| 0 0 | 1 1 | 2 G | 8 | 0.250 |
| 0 1 | 0 0 | 1 G | 4 | 0.250 |
| 0 1 | 0 1 | 1.33 G | 4 | 0.333 |
| 0 1 | 1 0 | 1.66 G | 4 | 0.415 |
| 0 1 | 1 1 | 2 G | 4 | 0.500 |
| 1 0 | 0 0 | 1 G | 2 | 0.500 |

A fixed input reference voltage $V_{ref}$, indicated at 313 is typically applied on line 315 to center the frequency of VCO 314 in the band selected.

As shown above, the least significant bits may be incremented while the divider ratio remains constant which enables multi-band voltage controlled oscillator 314 to increase the frequency of the clock signal on line 304. Incrementing the most significant bits, e.g., 0100, resets multi-band voltage controlled oscillator 314 to its lowest frequency, e.g., 1 GHz, and decreases the divider ratio (e.g., from 8 to 4). Incrementing the LSB (e.g., 0101) again increases the frequency of the VCO at the lower divider ratio, which further increases the frequency of the clock signal. The frequency adjustment bit pattern generated by frequency acquisition circuit 310 provides a controlled clock frequency which can be incremented in large steps and generates a wide range of frequencies for the clock signal, e.g., between about 10 MHz to 2 GHz.

Figure 11:
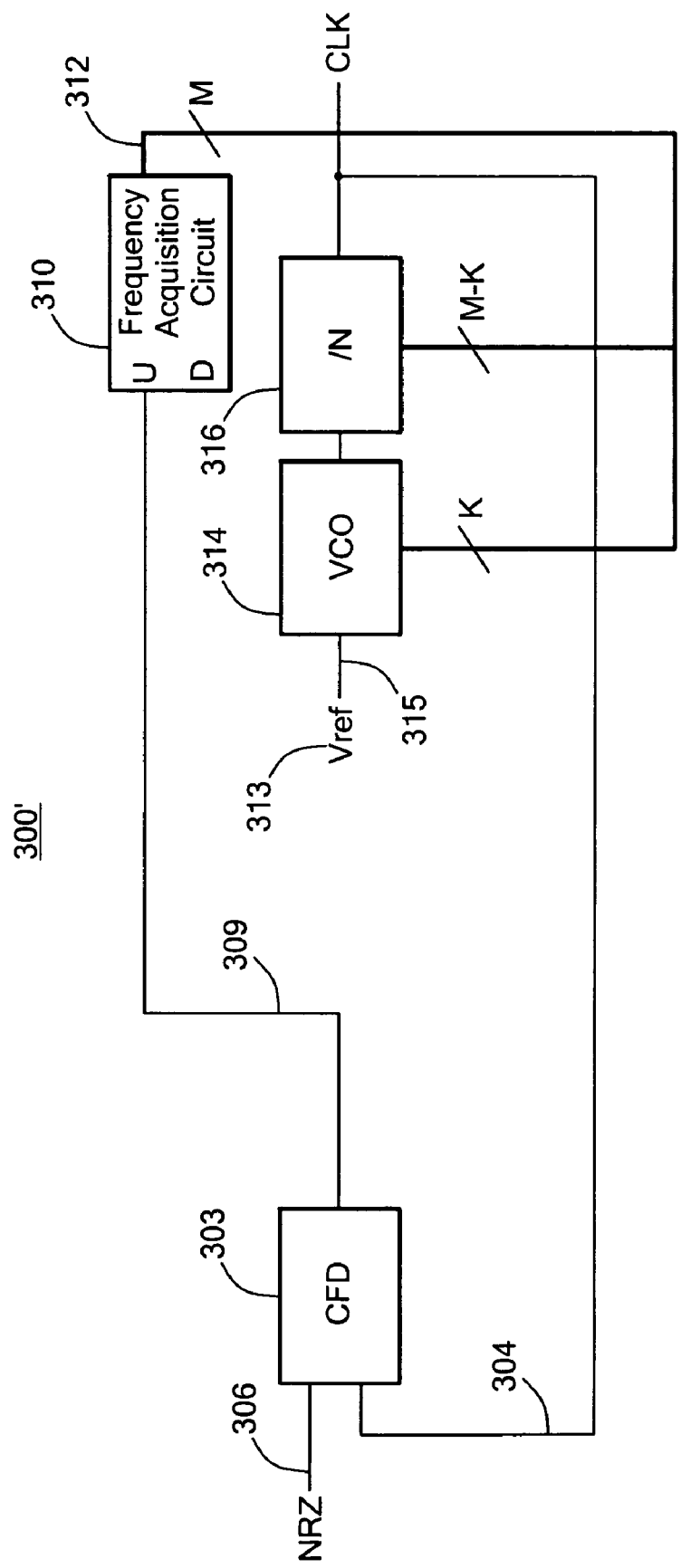
FIG. 11 is a schematic block diagram of another embodiment of an improved FLL coarse frequency detector system of this invention.

In another embodiment, frequency lock loop (FLL) coarse frequency detector system 300', FIG. 11, where like parts have been given like numbers, of this invention includes course frequency detector 303 which generates a down-signal on line 309 when the frequency of the clock signal on line 304 is greater than the frequency of the data signal on line 306. Frequency acquisition circuit 310 is responsive to the down-signal on line 309 and generates and decrements a frequency adjustment bit pattern on line 312 that selects a frequency band of multi-band voltage controlled oscillator 314 and divider ratio (N) of digital divider 316 to decrease the frequency of the clock signal on line 304 to be close to the frequency of the data signal on line 306.

Figure 12:
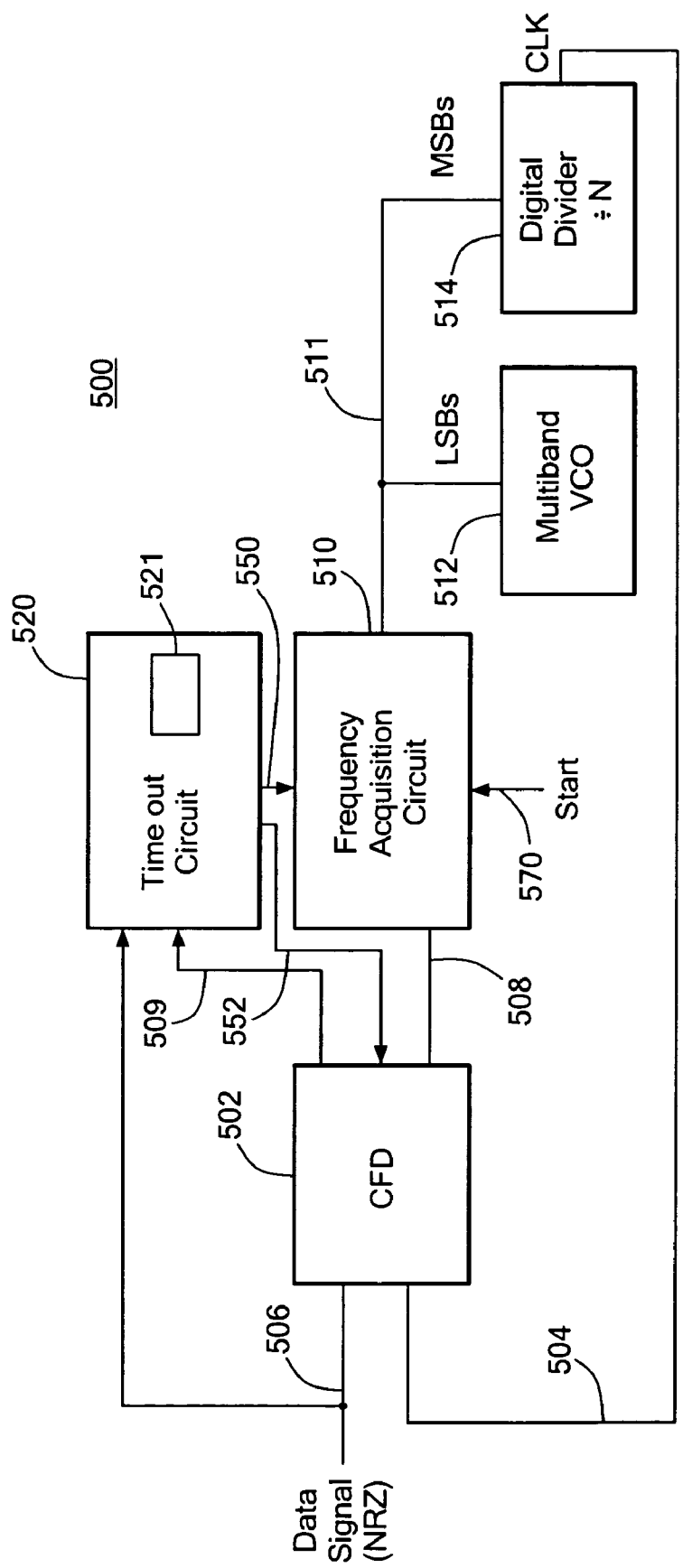
FIG. 12 is a schematic block diagram of yet another embodiment of an improved FLL coarse frequency detector system of this invention.

Improved FLL coarse frequency detector system 500, FIG. 12 of this invention includes coarse frequency detector 502, e.g., CFD 150, FIG. 4, which is responsive to a clock signal on line 504 and a data signal on line 506. Similarly as described above, CFD 502 detects two rising transitions of the same polarity from the data signal on line 506 within a predetermined state of a sub-multiple of the clock signal or a divided clock signal on line 504. This generates up-signals on lines 508 and 509 when two rising transitions of the same polarity are detected during the predetermined state of the divided clock signal. From this it can be determined whether the frequency of the clock signal on line 504 is less than the frequency of the data signal on line 506. System 500 also includes frequency acquisition circuit 510, of similar design to frequency acquisition circuit 310, FIG. 10, described above, which is responsive to the up-signal on line 508, FIG. 11. Frequency acquisition circuit 510 generates and increments a frequency adjustment bit pattern on line 511, as described above, that selects a frequency band of multi-band voltage controlled oscillator 512 and a divider ratio of digital divider 514 to increase the frequency of the clock signal on line 504.

Time-out circuit 520 is responsive to the up-pulse on line 509. The up-pulse on line 509 initializes time-out circuit 520. Time-out circuit is configured to detect a predetermined time-out parameter (discussed below) which indicates the frequency of the clock signal on line 504 is close to the frequency of the data signal on line 506. Time-out circuit 520 then generates stop signals on lines 550 and 552 to disable coarse frequency detector 502 and disable frequency acquisition circuit 510. The time-out parameter may be a predetermined number of transitions of the data signal on line 506, e.g., $2^{13}$ transitions, that have occurred since the last up-pulse on line 509 initialized time-out circuit 520. If no up-pulse is generated by CFD within the predetermined time out parameter, system 500 determines that the frequency of the clock signal on line 504 is close to frequency of the data signal on line 506, e.g., a coarse frequency lock has been achieved. The time-out parameter may also be a predetermined amount of time, such as a predetermined number of cycles of the clock signal on line 504 that have occurred since the last time an up-pulse on line 509 initialized time-out circuit 520.

In operation, a start signal on line 570 resets frequency acquisition circuit 510 to select the lowest frequency of multi-band voltage controlled oscillator 512, e.g., 1 GHz and sets digital divide circuit 514 to the highest divider ratio (e.g., N is set to 8), as discussed above and shown in Table 1. This combination sets a frequency of the clock signal on line 504 to a low predetermined frequency value (e.g., 0.125 GHz). CFD 502 detects the presence of two rising transitions (e.g., a target bit pattern) of the data signal on line 506, as described above within two periods of the clock signal on line 504. When the target bit pattern is detected in the data signal on line 506 the frequency of the clock signal on line 504 is less than the frequency of the data signal on line 506. CFD 502 then generates an up-pulse on line 508 which causes frequency acquisition circuit 510 to increment the frequency adjustment bit pattern on line 511. Frequency acquisition circuit 510 then selects the next highest band of multi-band VCO 512 and either the same or a lower divider ratio (N) as described above to increase the frequency of the clock signal on line 504. The process continues and the up-pulses on lines 508 and 509 are generated which resets time-out circuit 520. Eventually, when the frequency of the clock signal is high enough, e.g., the frequency of the clock signal on line 504 is equal to about 50% (or in a preferred embodiment, equal to about 10%) of the frequency of the data signal on line 506, no more up-pulses on lines 508 and 509 will be generated by CFD 502. At this point, time-out circuit determines if the predetermined time-out parameter, as discussed above, is reached. In one example, counter 521 counts transitions of the data signal on line 506 until the predetermined time-out parameter is reached, e.g., $2^{13}$ transitions in the data signal on line 506. In other examples, counter 521 determines if a predetermined amount of time has elapsed by counting transitions in the clock signal on line 504. When the predetermined time-out parameter is reached, a stop signal is generated on line 552 to disable CFD 502 and a stop signal on line 550 is generated to disable frequency acquisition circuit 510.

Figure 13:
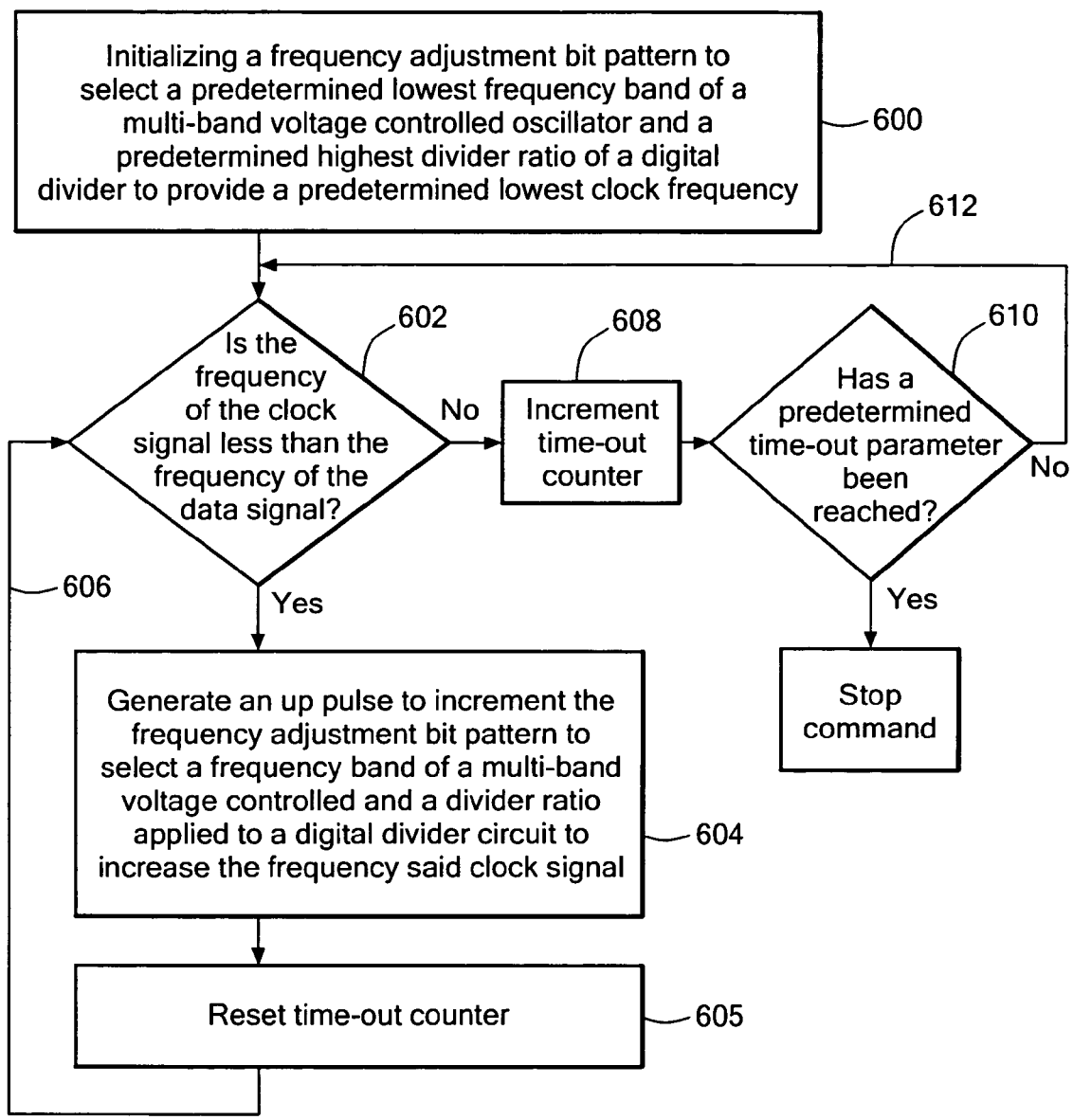
FIG. 13 is a schematic block diagram showing the method for locking the frequency of a clock signal close to a data signal in accordance with this invention.

Method 498, FIG. 13, for locking the frequency of a clock signal close to the frequency data signal of this invention includes the steps of initializing a frequency adjustment bit pattern to select a predetermined lowest frequency band of a multi-band voltage controlled oscillator and a predetermined highest divider ratio of a digital divider to provide a predetermined low clock frequency, step 600. The frequency of the clock signal is compared to the frequency of the data signal, step 602, e.g., by detecting two transitions of the same polarity during a predetermined state of a sub-multiple of the clock signal, step 602. If the frequency of the clock signal is less than the frequency of the data signal an up-pulse is generated which increments a frequency adjustment bit pattern to increase the frequency of the clock signal, step 604. The up-signal also resets time-out counter as step 605. Steps 602, 604 and 605 are repeated, as indicated by arrow 606, until the frequency of the clock signal is equal to the frequency of the data signal, e.g., a target bit pattern is not detected during the predetermined state of the sub-multiple of the clock signal. If the frequency of the clock signal is not less than the frequency of the data signal (e.g., two rising transitions are not detected within the predetermined state of the sub-multiple of the clock signal) an up-pulse is not generated and the time-out counter is incremented, step 608. A determination is then made if a predetermined time-out parameter has been reached, step 610. If not, the frequency of the clock signal is again compared to the frequency of the data signal, as indicated by line 612, e.g., have two transitions of the same polarity been detected in the data signal during the predetermined state of the sub-multiple of the clock signal, step 602. If two transitions of the same polarity are detected, an up-pulse is generated, step 604, and the time-out counter is again reset, step 605, otherwise the time-out counter is incremented, step 608. If the time-out parameter is reached, the frequency of the clock signal is coarsely locked to the frequency of the data signal, a stop command is generated, step 614, to disable the CFD.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. An improved coarse frequency detector comprising:
   a first storage device responsive to a data signal and a sub-multiple of a clock signal for detecting a first transition in said data signal during a predetermined state of said sub-multiple of said clock signal and generating an intermediate signal; and
   a second storage device responsive to said data signal and said intermediate signal for detecting a second transition in said data signal having the same polarity as said first transition during said predetermined state of said sub-multiple of said clock signal and generating an up-pulse.

2. The coarse frequency detector of claim 1 in which said first and second transitions are rising transitions.

3. The coarse frequency detector of claim 1 in which said first and second transitions are falling transitions.

4. The coarse frequency detector of claim 1 in which said predetermined state of said divided clock signal is equal to N periods of said clock signal.

5. The coarse frequency detector of claim 4 in which said predetermined state of said sub-multiple of said clock signal is equal to two periods of said clock signal.

6. The coarse frequency detector of claim 1 in which said predetermined state of said sub-multiple of said clock signal includes a logic low.

7. The coarse frequency detector of claim 1 in which a first rising transition of said up-pulse is generated in response to the detected second transition and the falling transition of said up-pulse is generated in response to a next transition of the same polarity as said second transition.

8. The coarse frequency detector of claim 1 in which said up-pulse has a width equal to at least two periods of said data signal.

9. The coarse frequency detector of claim 1 in which said sub-multiple of said clock signal is generated by dividing said clock signal by a predetermined number.

10. The coarse frequency detector of claim 1 in which said coarse frequency detector system includes a plurality of storage devices defining two or more parallel detection circuits each responsive to a sub-multiple of said clock signal and said data signal for detecting target bit patterns having at least two transitions of the same polarity in said data signal within a predetermined state of said sub-multiples of said clock signal.

11. An improved coarse frequency detector comprising:
    a plurality of storage devices responsive to a data signal and a sub-multiple of a clock signal for determining when the frequency of said clock signal is less than the frequency of said data signal by detecting a target bit pattern having successive transitions of the same polarity in said data signal during a predetermined state of said sub-multiple of said clock signal and generating an up-pulse.

12. The system of claim 11 in which said target bit patterns is chosen from the group consisting of 0101, 1010, 010101 and 101010.

13. An improved FLL coarse frequency detector system comprising:
    a coarse frequency detector responsive to a data signal and a sub-multiple of a clock signal for determining when the frequency of said clock signal is less than the frequency of said data signal by detecting a target bit pattern having successive transitions of the same polarity in said data signal during a predetermined state of said sub-multiple of said clock signal and providing an up-pulse in response to said detected bit pattern; and
    a frequency acquisition circuit responsive to said up-pulse for generating and incrementing a frequency adjustment bit pattern that selects a frequency band of a multi-band voltage controlled oscillator and a divider ratio of a digital divider to increase the frequency of said clock signal until the frequency of said clock signal is close to the frequency of said data signal.

14. The system of claim 13 in which said frequency adjustment bit pattern includes a plurality of least significant bits for selecting a frequency band of said voltage controlled oscillator and a plurality of most significant bits for selecting said digital divider ratio.

15. The system of claim 14 in which said frequency acquisition circuit increments said least significant bits to select a higher frequency band of said voltage controlled oscillator.

16. The system of claim 14 in which said frequency acquisition circuit increments said most significant bits to select a lower divider ratio to be applied to said digital divider to divide said clock signal by said divider ratio.

17. The system of claim 13 in which said target bit pattern is chosen from the group consisting of 0101, 1010, 010101 and 101010.

18. An improved FLL coarse frequency detector system comprising:
  a coarse frequency detector responsive to a clock signal and a data signal for generating an up-signal when the frequency of said clock signal is less than the frequency of said data signal; and
  a frequency acquisition circuit responsive to said up-signal for generating and incrementing a frequency adjustment bit pattern that selects a frequency band of a multi-band voltage controlled oscillator and a divider ratio of a digital divider to increase the frequency of said clock signal until the frequency of said clock signal is close to the frequency of said data signal.

19. An improved FLL coarse frequency detector system comprising:
  a coarse frequency detector responsive to a clock signal and a data signal for generating a down-signal when the frequency of said clock signal is greater than the frequency of said data signal; and
  a frequency acquisition circuit responsive to said down-signal for generating and decrementing a frequency adjustment bit pattern that selects a frequency band of a multi-band voltage controlled oscillator and a divider ratio of a digital divider to decrease the frequency of said clock signal until the frequency of said clock signal is close to the frequency of said data signal.

20. An improved FLL coarse frequency detector system comprising:
  a coarse frequency detector responsive to a sub-multiple of a clock signal and a data signal for determining when the frequency of said clock signal is less than the frequency of said data signal by detecting a target bit pattern having successive transitions of the same polarity in said data signal during a predetermined state of said sub-multiple of said clock signal and providing a frequency up-pulse in response to said detected bit pattern;
  a frequency acquisition circuit responsive to said up-pulse for generating and incrementing a frequency adjustment bit pattern that selects a frequency band of a multi-band voltage controlled oscillator and a divider ratio of a digital divider to increase the frequency said clock signal; and
  a time-out circuit responsive to said up-pulse and said data signal configured to detect a predetermined time-out parameter for indicating said frequency of said clock signal is close to the frequency of said data signal and for generating a stop signal to disable said coarse frequency detector and/or said frequency acquisition circuit.

21. The system of claim 20 in which said time-out circuit is responsive to said up-pulse and said clock signal for detecting a predetermined time-out parameter for indicating said frequency of said clock signal is close to the frequency of said data signal and for generating a stop signal to disable said coarse frequency detector and/or said frequency acquisition circuit.

22. The system of claim 20 in which said up-pulse initializes said time out circuit.

23. The system of claim 20 in which said time-out parameter is a predetermined number of transitions of said data signal that have occurred since said time-out circuit was initialized.

24. The system of claim 23 in which said transitions are the rising edges of said data signal.

25. The system of claim 23 in which said transitions are the falling edges of said data signal.

26. The system of claim 23 in which said time-out parameter is a predetermined amount of time.

27. The system of claim 26 in which said predetermined amount of time is a predetermined number of cycles of said clock signal.

28. The system of claim 20 in which said time-out circuit includes a binary counter configured to count said transitions of said data signal.

29. The system of claim 20 in which said target bit pattern is chosen from the group consisting of 0101, 1010, 010101 and 101010.

30. A method for locking the frequency of a clock signal to the frequency of a data signal, the method comprising:
  a) initializing a frequency adjustment bit pattern to select a predetermined lowest frequency band of a multi-band voltage controlled oscillator and a predetermined highest divider ratio of a digital divider to provide a predetermined lowest clock frequency;
  b) detecting successive transitions of the same polarity in said data signal during a predetermined state of a sub-multiple of said clock signal to determine that the frequency of said clock signal is less than the frequency of said data signal and generating an up-pulse;
  c) incrementing said frequency adjustment bit pattern in response to said up-signal to select a frequency band of a multi-band voltage controlled oscillator and a divider ratio applied to a digital divider circuit to increase the frequency of said clock signal; and
  d) repeating steps b) and c) until the frequency of said clock signal is coarsely equal to said data signal.

31. The method of claim 30 further including the step of detecting a predetermined time-out parameter for indicating said frequency of said clock signal is close to a predetermined amount of the frequency of a data signal and for generating a stop signal to disable said coarse frequency detector and/or a frequency acquisition circuit.

32. The method of claim 30 further including the step of detecting a target bit pattern having successive transitions of the same polarity in said data signal during a predetermined state of a divided clock signal to determine when the frequency of said clock signal is less than the frequency of said data signal.

* * * * *